(12) United States Patent
Nakamura et al.

(10) Patent No.: US 7,446,629 B2
(45) Date of Patent: Nov. 4, 2008

(54) ANTENNA DUPLEXER, AND RF MODULE AND COMMUNICATION APPARATUS USING THE SAME

(75) Inventors: Hiroyuki Nakamura, Katano (JP); Keiji Onishi, Settsu (JP); Tomohiro Iwasaki, Toyonaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 264 days.

(21) Appl. No.: 11/195,820

(22) Filed: Aug. 3, 2005

(65) Prior Publication Data

US 2006/0028298 A1 Feb. 9, 2006

(30) Foreign Application Priority Data

Aug. 4, 2004 (JP) ............................. 2004-227924

(51) Int. Cl.
*H03H 9/70* (2006.01)
*H03H 9/72* (2006.01)

(52) U.S. Cl. .................... 333/133; 333/189; 333/193

(58) Field of Classification Search .................. 333/133
See application file for complete search history.

(56) References Cited

U.S. PATENT DOCUMENTS

| | | | | |
|---|---|---|---|---|
| 3,868,608 A | * | 2/1975 | Williams | 333/193 |
| 5,554,960 A | * | 9/1996 | Ohnuki et al. | 333/132 |
| 6,380,823 B1 | * | 4/2002 | Ikata et al. | 333/133 |
| 6,424,238 B1 | * | 7/2002 | Penunuri | 333/187 |
| 6,472,954 B1 | * | 10/2002 | Ruby et al. | 333/133 |
| 6,570,469 B2 | * | 5/2003 | Yamada et al. | 333/193 |
| 6,759,928 B2 | * | 7/2004 | Endou et al. | 333/193 |
| 6,765,456 B2 | * | 7/2004 | Ehara et al. | 333/133 |
| 7,084,718 B2 | * | 8/2006 | Nakamura et al. | 333/133 |
| 7,102,460 B2 | * | 9/2006 | Schmidhammer et al. | 333/133 |
| 2003/0107454 A1 | * | 6/2003 | Nakamura et al. | 333/133 |
| 2003/0128081 A1 | * | 7/2003 | Ella et al. | 333/133 |
| 2003/0169129 A1 | * | 9/2003 | Takamine | 333/195 |
| 2003/0214369 A1 | * | 11/2003 | Kearns | 333/133 |
| 2004/0140868 A1 | * | 7/2004 | Takeuchi et al. | 333/189 |

FOREIGN PATENT DOCUMENTS

| | | |
|---|---|---|
| JP | 04-369111 | 12/1992 |
| JP | 2001-024476 | 1/2001 |
| JP | 2001-292050 | * 10/2001 |
| JP | 2003-249842 | 9/2003 |
| JP | 2003-347889 | 12/2003 |
| WO | WO 98/34345 | * 8/1998 |

OTHER PUBLICATIONS

T. Morita et al., "Wideband Low Loss Double Mode SAW Filters," Proc. IEEE Ultrasonics Symposium (1992), pp. 95-104.

* cited by examiner

*Primary Examiner*—Barbara Summons
(74) *Attorney, Agent, or Firm*—Wenderoth, Lind & Ponack, L.L.P.

(57) ABSTRACT

One of plurality of transmission terminals connected to a transmission filter and a receiving terminal connected to a receiving filter is a balanced type terminal, and another is an unbalanced type terminal. The transmission filter and the receiving filter includes surface acoustic wave resonators or film bulk acoustic resonators. The balanced type terminal is connected to a longitudinal mode coupled surface acoustic wave filter.

23 Claims, 15 Drawing Sheets 700 (700a)

700 (700a)

ANTENNA DUPLEXER, AND RF MODULE AND COMMUNICATION APPARATUS USING THE SAME

BACKGROUND OF THE INVENTION

1. Field of the Invention

The present invention relates to an antenna duplexer, and more specifically to an antenna duplexer including a transmission filter and a receiving filter. The present invention also relates to an RF module and a communication apparatus using such an antenna duplexer.

2. Description of the Background Art

Recently, along with the development of mobile communication, there have been demands for devices used for mobile communication which provide higher performance with smaller sizes. Antenna duplexers, as well as other devices, are being more and more reduced in size by using surface acoustic wave filters (SAW filters) or filters using film bulk acoustic resonators (FBARs) Semiconductor devices such as mixers and low noise amplifiers are being altered to have a balanced structure for the purpose of improving the noise characteristic against inter-device crosstalk and the like. Antenna duplexers to be used in connection with such semiconductor devices need to have a balanced structure.

FIG. 15 shows a structure of an antenna duplexer described in Japanese Laid-Open Patent Publication No. 2001-24476. As shown in FIG. 15, one conventional type of antenna duplexer uses a band pass filter having a ladder type circuit including FBARs. This conventional antenna duplexer (represented by reference numeral 10) includes an antenna terminal 11, a transmission terminal 12, a receiving terminal 13, a transmission filter 14, a phase shifter 15, and a receiving filter 16. The antenna terminal 11 is connected to the transmission terminal 12 via the transmission filter 14 and is also connected to the receiving terminal 13 via the 90° phase shifter 15 and the receiving filter 16. The 90° phase shifter 15 and the receiving filter 16 are connected in series. The transmission filter 14 include FBARs 14a, 14b and 14c connected in series to form a series resonator, and FBARs 14d and 14e connected in parallel to the series resonator. The FBARs 14a, 14b and 14c and the FBARs 14d and 14e are connected to form a ladder type circuit. The receiving filter 16 include FBARs 16a, 16b and 16c connected in series to form a series resonator, and FBARs 16d, 16e, 16f and 16g connected in parallel to the series resonator. The FBARs 16a, 16b and 16c and the FBARs 16d, 16e, 16f and 16g are connected to form a ladder type circuit.

In the case of, for example, a PCS (Personal Communication System), the transmission filter 14 and the receiving filter 16 are configured such that the high frequency rejection band of the transmission filter 14 overlaps the passband of the receiving filter 16 and such that the low frequency rejection band of the receiving filter 16 overlaps the passband of the transmission filter 14.

FIG. 16 shows a structure of an antenna duplexer described in Japanese Laid-Open Patent Publication No. 2003-249842. As shown in FIG. 16, one conventional type of antenna duplexer uses a band pass filter having a ladder type circuit including SAW filters. This conventional antenna duplexer (represented by reference numeral 20) includes an antenna terminal 11, a transmission terminal 12, a receiving terminal 13, a transmission filter 21, a phase shifter 15, and a receiving filter 22. The antenna terminal 11 is connected to the transmission terminal 12 via the transmission filter 21 and is also connected to the receiving terminal 13 via the 90° phase shifter 15 and the receiving filter 22. The 90° phase shifter 15 and the receiving filter 22 are connected in series. The transmission filter 21 include SAW resonators 21a, 21b and 21c connected in series to form a series resonator, and SAW resonators 21d and 21e connected in parallel to the series resonator. The SAW resonators 21a, 21b and 21c and the SAW resonators 21d and 21e are connected to form a ladder type circuit. The receiving filter 22 includes SAW resonators 22a and 22b connected in parallel to the receiving terminal 13.

In the case of, for example, a PCS (Personal Communication System), the transmission filter 21 and the receiving filter 22 are configured such that the high frequency rejection band of the transmission filter 21 overlaps the passband of the receiving filter 22 and such that the low frequency rejection band of the receiving filter 22 overlaps the passband of the transmission filter 21.

As described above, the conventional antenna duplexers have a ladder circuit including FBARs or SAW resonators. However, the transmission terminal and the receiving terminal in the conventional antenna duplexers are of unbalanced type. Therefore, a semiconductor device or the like having a balanced type terminal cannot be directly connected to such an antenna duplexer. In addition, the conventional antenna duplexers, which include an unbalanced type terminal, have characteristics which are deteriorated by the influence of noise such as crosstalk and the like.

BREIF SUMMARY OF THE INVENTION

Therefore, an object of the present invention is to provide an antenna duplexer for allowing a semiconductor device having a balanced type terminal to be directly connected thereto. Another object of the present invention is to provide an RF module and a communication apparatus using such an antenna duplexer.

The present invention has the following features to attain the objects mentioned above. A first aspect of the present invention is directed to an antenna duplexer comprising an antenna; a transmission terminal; a receiving terminal; a transmission filter connected between the antenna terminal and the transmission terminal; and a receiving filter connected between the antenna terminal and the receiving terminal. Either one of the transmission terminal connected to the transmission filter and the receiving terminal connected to the receiving filter is a balanced type terminal, and the other is an unbalanced type terminal; the transmission filter and the receiving filter includes surface acoustic wave resonators or film bulk acoustic resonators; and the balanced type terminal is connected to a longitudinal mode coupled surface acoustic wave filter.

According to the first aspect of the present invention, either one of the transmission terminal connected to the transmission filter and the receiving terminal connected to the receiving filter is a balanced type terminal, and the other is an unbalanced type terminal. Therefore, an antenna duplexer which can be directly connected to a semiconductor device having a balanced type terminal without using a balun or the like is provided. As a result, an apparatus including such an antenna duplexer is entirely reduced in size. The balanced type terminal is connected to a longitudinal mode coupled surface acoustic wave filter. This realizes an efficient balanced-unbalanced conversion.

Preferably, the transmission filter or the receiving filter which is connected to the unbalanced type terminal is a ladder type filter including the surface acoustic wave resonators or the film bulk acoustic resonators.

By using a ladder type filter as a filter connected to the unbalanced type terminal as described above, a filter characteristic having low loss can be obtained, and thus a desirable frequency response can be obtained.

Preferably, the transmission filter or the receiving filter which is connected to the balanced type terminal includes at least one surface acoustic wave resonator or at least one film bulk acoustic resonator connected in series between the longitudinal mode coupled surface acoustic wave filter and the antenna terminal.

The longitudinal mode coupled surface acoustic wave filter has a filter characteristic by multiple mode coupling. Therefore, as long as at least one surface acoustic wave resonator or at least one film bulk acoustic resonator is connected between the longitudinal mode coupled surface acoustic wave filter and the antenna terminal, a desirable filter characteristic can be obtained.

Preferably, the transmission filter or the receiving filter which is connected to the balanced type terminal includes a ladder type filter, including the surface acoustic wave resonators or the film bulk acoustic resonators, connected between the longitudinal mode coupled surface acoustic wave filter and the antenna terminal.

Owing to such a structure, a more desirable filter characteristic can be obtained.

Preferably, the antenna duplexer further comprises a phase shifter for adjusting the phase of an impedance of the transmission filter or the receiving filter at least either between the transmission filter and the antenna terminal or between the receiving filter and the antenna terminal.

Owing to such a structure, a signal can be prevented from bypassing.

For example, the phase shifter is preferably a strip line or a lumped constant device.

Owing to such a structure, the phase of the filter connected to the phase shifter can be adjusted.

Preferably, the transmission filter and/or the receiving filter connected to the phase shifter, which is also connected to the antenna terminal, includes a film bulk acoustic resonator connected to the phase shifter.

With the structure where the film bulk acoustic resonator is connected to the phase shifter in series, the power durability of the filter at the rejection band is improved.

Preferably, the phase shifter and the film bulk acoustic resonator connected to the phase shifter are provided on one (the same) substrate.

Owing to such a structure, the reduction in loss of the phase shifter is realized, and in addition, the power durability of the filter at the rejection band is improved.

In one embodiment, the transmission terminal connected to the transmission filter is preferably the unbalanced type terminal.

Owing to such a structure, a low noise amplifier connected to the receiving terminal, which is often a balanced type terminal, can be connected to a balanced type terminal of the antenna duplexer. In addition, by using the balanced type terminal as the receiving terminal, the signal to noise characteristic is improved.

Preferably, the transmission terminal as the unbalanced type terminal connected to the transmission filter is connected to the film bulk acoustic resonator.

Owing to such a structure, the power durability against a high output transmission signal from the power amplifier connected to the transmission terminal is improved.

Preferably, the transmission filter is a ladder type filter; and a series resonator in the ladder type filter includes the film bulk acoustic resonators.

Owing to such a structure, the phase of the impedance of a transmission filter as seen from the antenna terminal becomes closer to being open. Therefore, leakage of a receiving signal toward the transmission side is reduced, and the phase shifter on the transmission side can be simplified or even omitted.

Preferably, a parallel resonator in the ladder type filter includes the film bulk acoustic resonators.

By using a ladder type filter including film bulk acoustic resonators as the transmission filter as described above, a desirable filter characteristic is more easily obtained.

Preferably, the receiving filter includes at least one film bulk acoustic resonator as an acoustic wave resonator other than the longitudinal mode coupled surface acoustic wave filter.

Owing to such a structure, a desirable receiving filter characteristic is more easily obtained.

Preferably, the transmission filter and the receiving filter are mounted on one, same mounting substrate.

Owing to such a structure, the antenna duplexer can be reduced in size.

In one embodiment, the transmission filter and/or the receiving filter is preferably mounted on the mounting substrate by face-down bonding.

Owing to such a structure, a low-profile antenna duplexer is provided.

Preferably, the transmission filter and the receiving filter have substantially an equal thickness.

Owing to such a structure, the antenna duplexer can be adsorbed by a pick-up tool used for mounting.

In one embodiment, the transmission filter and the receiving filter are preferably molded by a resin.

Owing to such a structure, the upper surface of the antenna duplex can be made flat.

Preferably, an upper surface of the resin is substantially flat.

Owing to such a structure, the antenna duplexer can be adsorbed by a pick-up tool used for mounting.

A second aspect of the present invention is directed to an RF module including an antenna duplexer and a semiconductor device which are mounted on one, same mounting substrate. The antenna duplexer includes an antenna; a transmission terminal; a receiving terminal; a transmission filter connected between the antenna terminal and the transmission terminal; and a receiving filter connected between the antenna terminal and the receiving terminal. Either one of the transmission terminal connected to the transmission filter and the receiving terminal connected to the receiving filter is a balanced type terminal, and the other is an unbalanced type terminal; the transmission filter and the receiving filter includes surface acoustic wave resonators or film bulk acoustic resonators; and the balanced type terminal is connected to a longitudinal mode coupled surface acoustic wave filter.

According to the second aspect of the present invention, a compact RF device having superb characteristics is provided.

For example, the semiconductor device is a low noise amplifier.

In this case, an RF device having superb receiving characteristics is provided.

For example, the semiconductor device is a switch.

In this case, an RF device including an antenna duplexer compatible to multi-mode or multi-band applications is provided.

A third aspect of the present invention is directed to a communication apparatus including an antenna duplexer. The antenna duplexer includes an antenna; a transmission terminal; a receiving terminal; a transmission filter connected between the antenna terminal and the transmission terminal;

and a receiving filter connected between the antenna terminal and the receiving terminal. Either one of the transmission terminal connected to the transmission filter and the receiving terminal connected to the receiving filter is a balanced type terminal, and the other is an unbalanced type terminal; the transmission filter and the receiving filter includes surface acoustic wave resonators or film bulk acoustic resonators; and the balanced type terminal is connected to a longitudinal mode coupled surface acoustic wave filter.

According to the third aspect of the present invention, a compact communication apparatus having superb receiving characteristics and transmission characteristics is provided.

As described above, according to the present invention, an antenna duplexer which can be directly connected to an RF device having a balanced type terminal is provided. In addition, an RF module and a communication apparatus including such an antenna duplexer are provided.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1D shows a specific circuit configuration of the antenna duplexer 100a;

DETAILED DESCRIPTION OF THE INVENTION

Hereinafter, the present invention will be described by way of embodiments with reference to the attached drawings.

First Embodiment

Figure 1A:
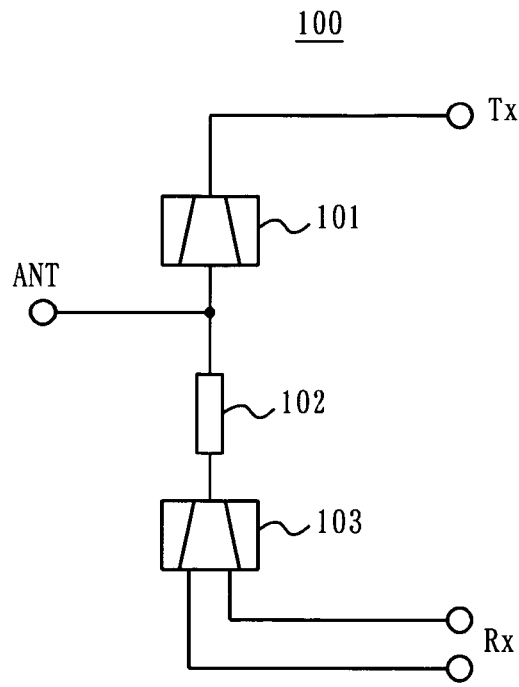
FIG. 1A is a block diagram showing a structure of an antenna duplexer 100 according to a first embodiment of the present invention.

FIG. 1A is a block diagram showing a structure of an antenna duplexer 100 according to a first embodiment of the present invention. In FIG. 1A, the antenna duplexer 100 includes an antenna terminal ANT, a transmission terminal Tx, a receiving terminal Rx, a transmission filter 101, a phase shifter 102, and a receiving filter 103. The antenna terminal ANT is an unbalanced type terminal. The receiving terminal Rx is a balanced type terminal. The transmission terminal Tx is an unbalanced type terminal. The antenna terminal ANT is connected to the transmission terminal Tx via the transmission filter 101. The antenna terminal ANT is also connected to the receiving terminal Rx via the phase shifter 102 and the receiving filter 103. The receiving filter 103 has a balanced-unbalanced conversion function. Owing to this function, a received input signal (unbalanced signal) from the antenna terminal ANT, which is an unbalanced type terminal, is transmitted to the receiving terminal Rx as a balanced signal (differential mode signal).

As described above, the antenna duplexer 100 realizes the balanced type terminal Rx using a filter having a balanced-unbalanced conversion function. The antenna duplexer 100 can be directly connected to a balanced type semiconductor device (not shown) such as a low noise amplifier or the like without using a balanced-unbalanced converter such as a balun or the like.

Figure 1B:
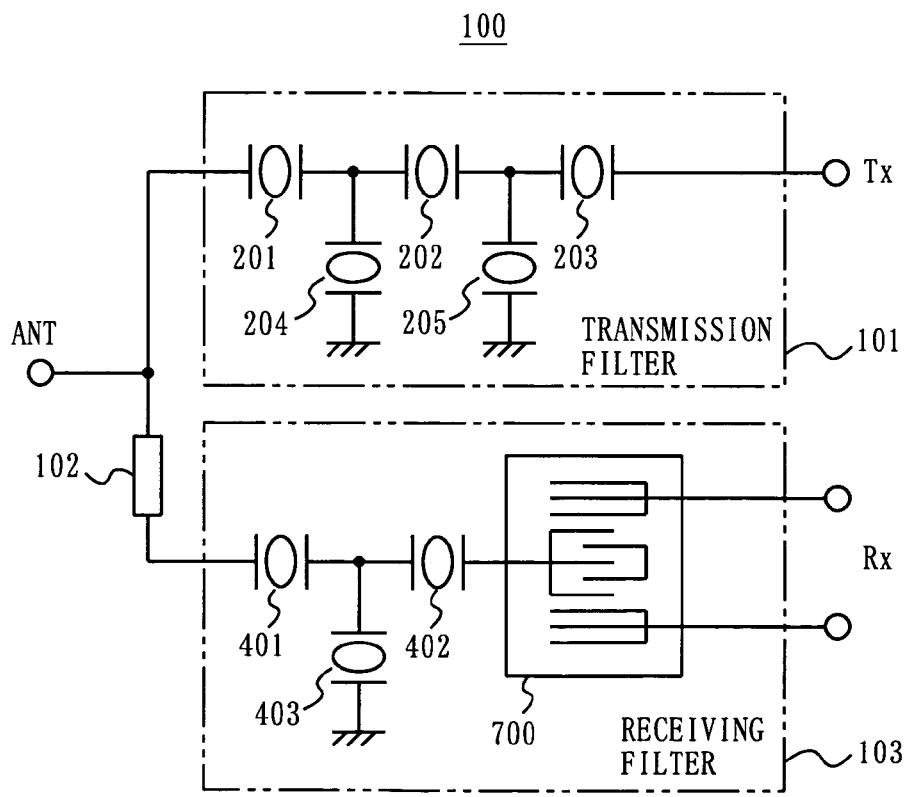
FIG. 1B shows a specific circuit configuration of the antenna duplexer 100.

FIG. 1B shows a specific circuit configuration of the antenna duplexer 100. In FIG. 1B, the transmission filter 101 includes FBARs 201, 202 and 203 connected in series to form a series resonator, and FBARs 204 and 205 connected in parallel to the series resonator to form a parallel resonator. The FBARs 201, 202 and 203 and the FBARs 204 and 205 are connected to form a ladder type circuit. The receiving filter 103 includes FBARs 401 and 402 connected in series to form a series resonator, an FBAR 403 connected in parallel to the series resonator as a parallel resonator, and a longitudinal mode coupled surface acoustic wave filter (hereinafter, also referred to as an "SAW filter") 700 connected between the FBAR 402 and the receiving terminal Rx. The FBARs 401 and 402 and the FBAR 403 are connected to form a ladder type circuit.

The phase shifter 102 is a device for adjusting the phase of an impedance of the receiving filter 103 in order to prevent a transmission signal from bypassing to the receiving filter 103. The phase shifter 102 is a strip line or a lumped constant device.

As shown in FIG. 1B, the balanced type terminal (in this example, the receiving terminal Rx) is connected to the longitudinal mode coupled SAW filter 700. By using a longitudinal mode coupled SAW filter as described above, an unbalanced signal can be efficiently converted into a balanced signal.

Figure 1C:
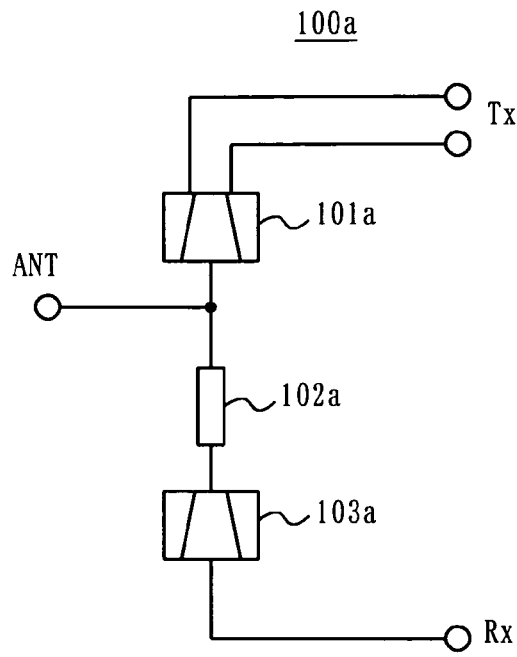
FIG. 1C is a block diagram showing a structure of an antenna duplexer 100a in which a filter having a balanced-unbalanced conversion function is provided on the transmission side.

In FIG. 1A and FIG. 1B, the receiving filter 103 has the balanced-unbalanced conversion function. A filter having the balanced-unbalanced conversion function may be provided on the transmission side. FIG. 1C is a block diagram showing a structure of an antenna duplexer 100a including a filter having the balanced-unbalanced conversion function on the transmission side. In FIG. 1C, the antenna duplexer 100a includes an antenna terminal ANT, a transmission terminal Tx, a receiving terminal Rx, a transmission filter 101a, a phase shifter 102a, and a receiving filter 103a. The antenna terminal ANT is an unbalanced type terminal. The receiving terminal Rx is an unbalanced type terminal. The transmission terminal Tx is a balanced type terminal. The antenna terminal ANT is connected to the transmission terminal Tx via the transmission filter 101a. The antenna terminal ANT is also connected to the receiving terminal Rx via the phase shifter 102a and the receiving filter 103a. The transmission filter 101a has a balanced-unbalanced conversion function. Owing to this function, a balanced signal from the transmission terminal Tx, which is a balanced type terminal, is converted into an unbalanced signal and is output from the antenna terminal ANT.

As described above, the antenna duplexer 100a realizes the balanced type terminal Tx using a filter having a balanced-unbalanced conversion function. The antenna duplexer 100a can be directly connected to a balanced type semiconductor device (not shown) such as a power amplifier or the like without using a balanced-unbalanced converter such as a balun or the like.

Figure 1D:
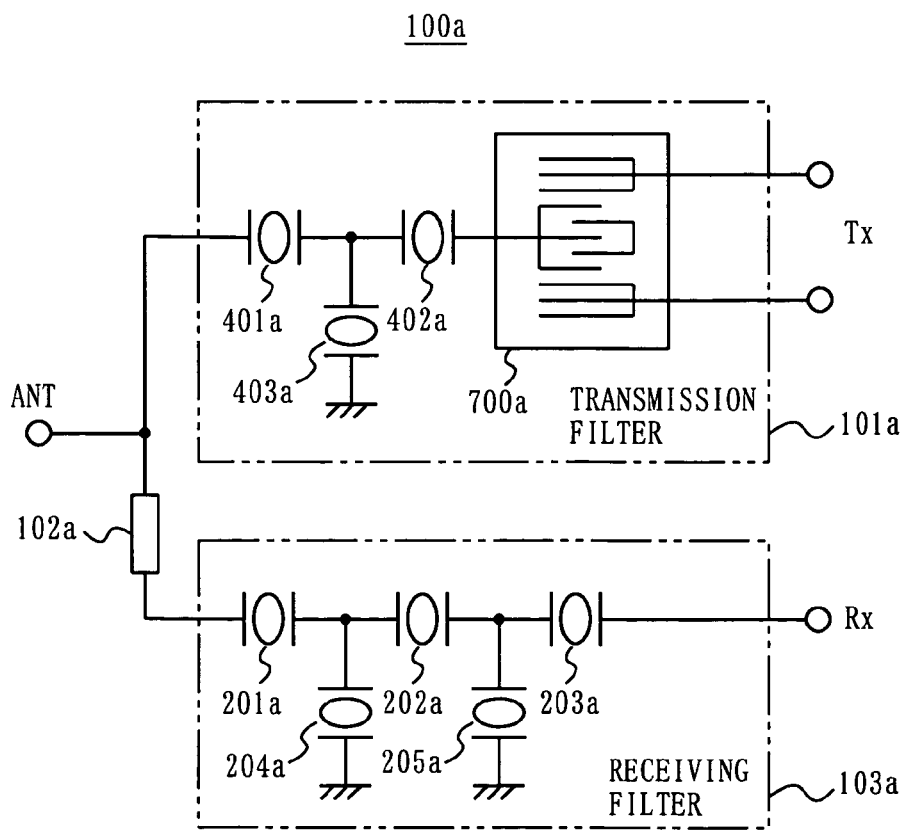

FIG. 1D shows a specific circuit configuration of the antenna duplexer 100a. In FIG. 1D, the receiving filter 103a includes FBARs 201a, 202a and 203a connected in series to form a series resonator, and FBARs 204a and 205a connected in parallel to the series resonator to form a parallel resonator. The FBARs 201a, 202a and 203a and the FBARs 204a and 205a are connected to formal adder type circuit. The transmission filter 101a includes FBARs 401a and 402a connected in series to form a series resonator, a FBAR 403a connected in parallel to the series resonator as a parallel resonator, and a longitudinal mode coupled SAW filter 700a connected between the FBAR 402a and the transmission terminal Tx. The FBARs 401a and 402a and the FBAR 403a are connected to form a ladder type circuit.

The phase shifter 102a is a device for adjusting the phase of an impedance of the receiving filter 103a in order to prevent a transmission signal from bypassing to the receiving filter 103a. The phase shifter 102a includes a strip line or a lumped constant device.

As shown in FIG. 1D, the balanced type terminal (in this example, the transmission terminal Tx) is connected to the longitudinal mode coupled SAW filter 700a. By using a longitudinal mode coupled SAW filter as described above, an unbalanced signal can be efficiently converted into a balanced signal.

As described above, in the first embodiment, either one of the transmission terminal connected to the transmission filter and the receiving terminal connected to the receiving filter is a balanced type terminal, and the other is an unbalanced type terminal. The balanced type terminal is connected to a longitudinal mode coupled surface acoustic wave filter. Owing to such a structure, efficient balanced-unbalanced conversion is made possible.

Figure 2A:
FIG. 2A shows a circuit symbol of an FBAR and an SAW resonator.

FIG. 2A shows a circuit symbol of an FBAR and an SAW resonator. In FIG. 1B and FIG. 1D, FBARs are used as acoustic wave resonators in the transmission filter and the receiving filter. Alternatively, SAW resonator may be used.

Figure 2B:
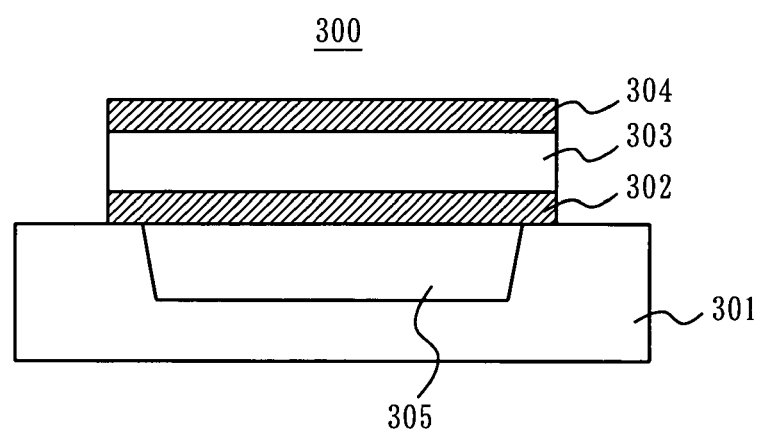
FIG. 2B is a cross-sectional view showing a structure of an FBAR.

FIG. 2B is a cross-sectional view showing a structure of an FBAR. In FIG. 2B, an FBAR 300 includes a lower electrode 302, a piezoelectric thin film 303, and an upper electrode 304 which are provided on a substrate 301. The substrate 301 below the lower electrode 302 has a cavity 305 formed therein. This structure realizes an energy trapped resonator. The upper electrode 304 and the lower electrode 302 respectively correspond to an input electrode and an output electrode of a single FBAR. The substrate 301 is formed of, for example, Si. The upper electrode 304 and the lower electrode 302 are formed of, for example, Al, Mo, Au, Cu, or Ti. The piezoelectric thin film 303 is formed of, for example, AlN or ZnO.

Figure 2C:
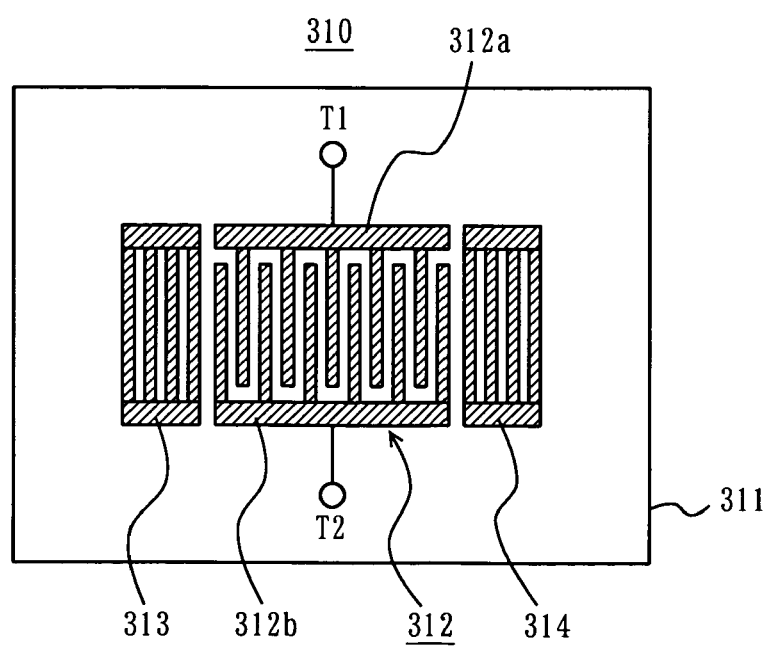
FIG. 2C shows a structure of an SAW resonator.

FIG. 2C shows a structure of an SAW resonator. In FIG. 2C, an SAW resonator 310 includes an IDT electrode 312 which is a comb-like electrode provided on a piezoelectric substrate 311, and reflector electrodes 313 and 314 provided on both of two sides of the IDT electrode 312. The IDT electrode 312 includes comb-like electrodes 312a and 312b, respectively having terminals T1 and T2. The terminals T1 and T2 respectively correspond to an input electrode and an output electrode of a single surface acoustic wave resonator. A surface acoustic wave which is excited by the IDT electrode 312 is trapped by the reflector electrodes 313 and 314. Thus, the SAW resonator 310 is realized as an energy trapped resonator. The piezoelectric substrate 311 is formed of, for example, LiTaO$_3$, LiNbO$_3$ or quartz. The IDT electrode 312 and the reflector electrodes 313 and 314 are formed of, for example, Al, Ti, Cu, or Al—Cu. Especially where the SAW resonator 310 is uses a transmission filter, the IDT electrode 312 is preferably formed of an electrode material having a high power durability.

Figure 3A:
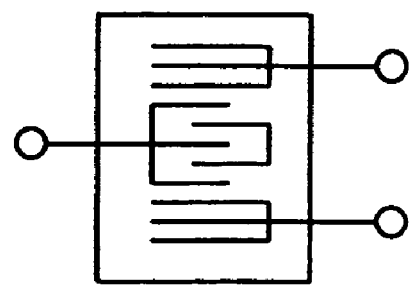
FIG. 3A shows a circuit symbol of a longitudinal mode coupled SAW filter 700 (or 700a)
Figure 3B:
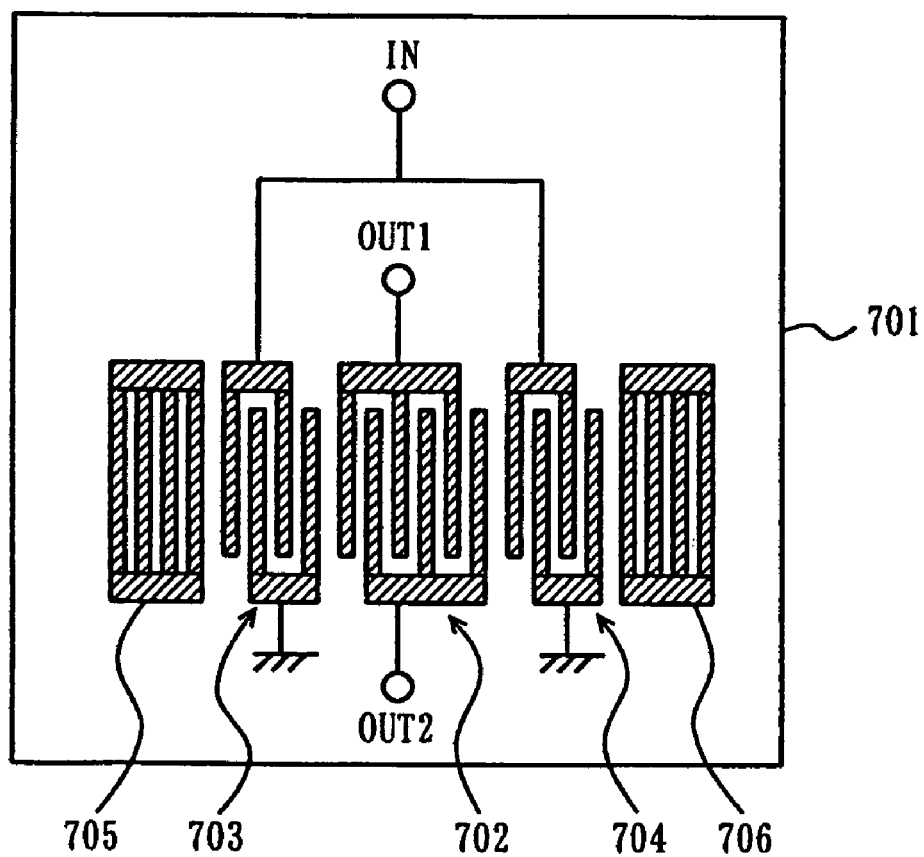
FIG. 3B shows a structure of the longitudinal mode coupled SAW filter 700 (or 700a)

FIG. 3A shows a circuit symbol of the longitudinal mode coupled SAW filter 700 and the longitudinal mode coupled SAW filter 700a. FIG. 3B shows a structure of the longitudinal mode coupled SAW filter 700 (or 700a). In FIG. 3B, the longitudinal mode coupled SAW filter 700 (or 700a) includes first, second and third IDT electrodes 702, 703 and 704, and first and second reflector electrodes 705 and 706, which are all provided on a piezoelectric substrate 701. Upper electrode fingers of the first IDT electrode 702 are connected to an output terminal OUT1 among two output terminals forming a balanced type terminal. Lower electrode fingers of the first IDT electrode 702 are connected to an output terminal OUT2 among the two output terminals forming the balanced type terminal. An input terminal IN corresponds to the FBAR 402 side in FIG. 1B (or the FBAR 402a side in FIG. 1D). The output terminals OUT1 and OUT2 correspond to the receiving terminal Rx side in FIG. 1B (or the transmission terminal Tx side in FIG. 1D). Either one of upper electrode fingers and lower electrode fingers of each of the IDT electrode 703 and 704 are connected to the input terminal IN, which is an unbalanced type terminal. The other electrode fingers of each of the IDT electrode 703 and 704 are grounded. Owing to the above-described structure, a longitudinal mode coupled surface acoustic wave filter having a balanced-unbalanced conversion function is realized.

A longitudinal mode coupled SAW filter can obtain a filter characteristic by acoustically coupling and superimposing a plurality of modes (the symmetrical mode and the asymmetrical mode) generated in the same direction as the propagation direction of the surface acoustic wave (transverse direction in FIG. 3B). Such an SAW filter is referred to as a "longitudinal mode coupled SAW filter" or a "double mode SAW (DMS) filter". By contrast, an SAW resonator using modes generated in a direction vertical to the propagation direction of the surface wave is referred to as a "transverse mode coupled SAW filter". From the upper and lower electrode fingers of the first IDT electrode 702 which are inserted into each other, signals having phases shifted by 180 degrees are obtained. Therefore, by coupling the modes between the unbalanced input terminal and the balanced output terminal, the balanced-unbalanced conversion can be realized (see, for the details, T. Morita, Y. Watanabe, M. Tanaka and Y. Nakazawa, "Wideband Low Loss Double Mode SAW Filters", Proc. IEEE Ultrason. Symp. (1992) pp. 95-104.)

Figure 3C:
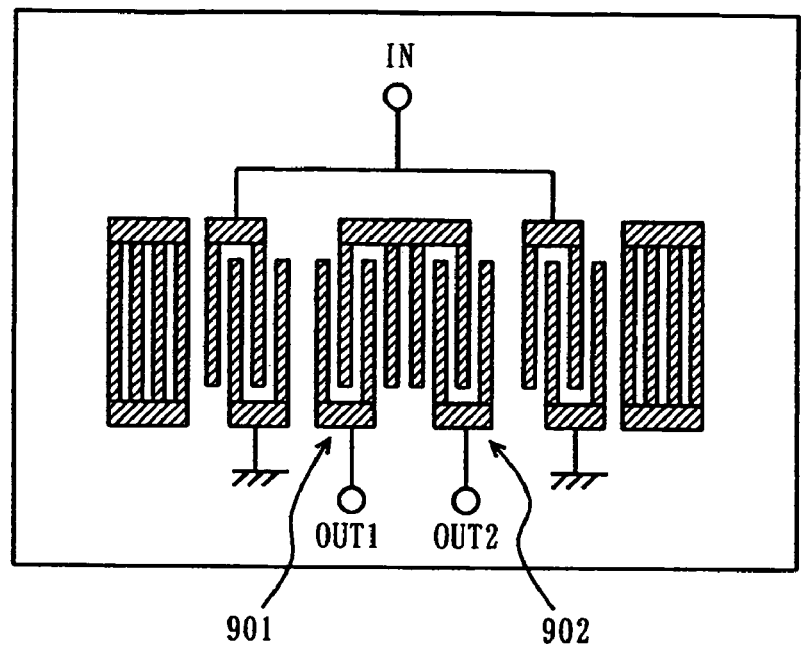
FIG. 3C shows another structure of the longitudinal mode coupled SAW filter 700 (or 700a)

FIG. 3C shows another structure of the longitudinal mode coupled SAW filter 700 (or 700*a*). The longitudinal mode coupled SAW filter 700 (or 700*a*) shown in FIG. 3C is different from the longitudinal mode coupled SAW filter 700 (or 700*a*) shown in FIG. 3B in that the latter includes two IDT electrodes 901 and 902, instead of the first IDT electrode 702 of the former. Like the first IDT electrode 702, the IDT electrodes 901 and 902 are connected to the output terminals OUT1 and OUT2 forming the balanced type terminal.

Figure 3D:
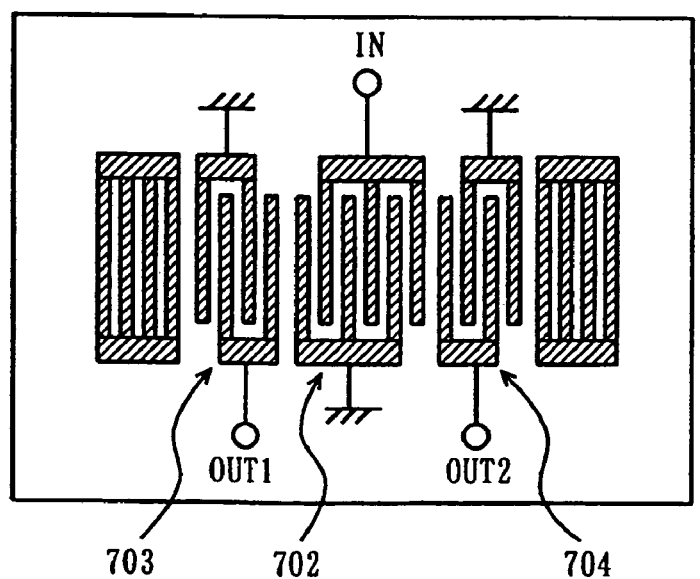
FIG. 3D shows still another structure of the longitudinal mode coupled SAW filter 700 (or 700a)

FIG. 3D shows still another structure of the longitudinal mode coupled SAW filter 700 (or 700*a*). The longitudinal mode coupled SAW filter 700 (or 700*a*) shown in FIG. 3D is different from the longitudinal mode coupled SAW filter 700 (or 700*a*) shown in FIG. 3B in that in the latter, the first IDT electrode 702 is connected to the input terminal IN, which is an unbalanced type terminal, and the second and third IDT electrodes 702 and 703 are respectively connected to the output terminals OUT1 and OUT2 forming a balanced type terminal.

Figure 4:
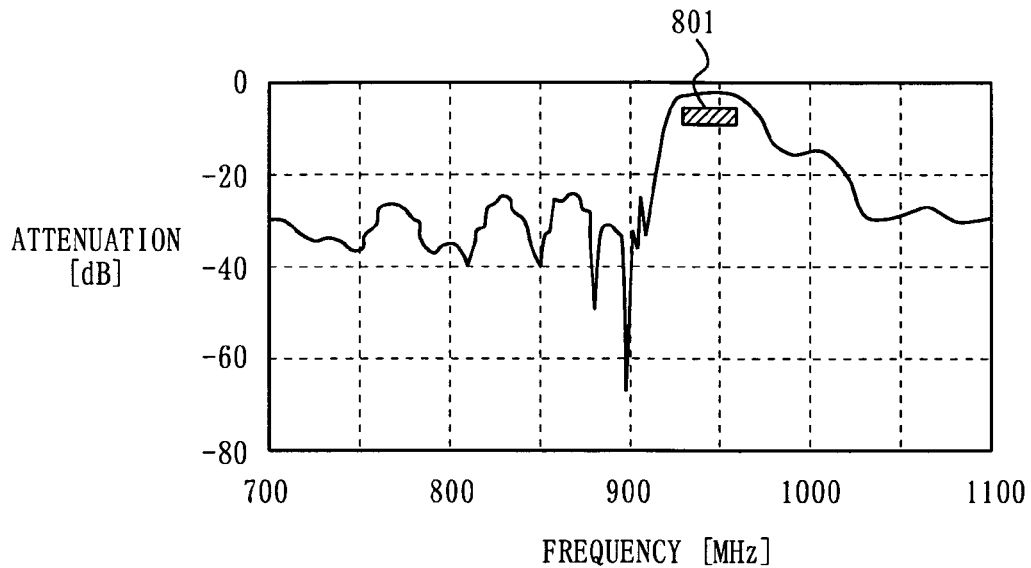
FIG. 4 is a graph illustrating a frequency response of the longitudinal mode coupled SAW filter 700 shown in FIG. 3B.

FIG. 4 is a graph illustrating a frequency response of the longitudinal mode coupled SAW filter 700 (or 700*a*) shown in FIG. 3B. By adjusting the inter-electrode finger distance of each IDT electrode, the width with which the electrode fingers of each IDT overlap each other, the inter-IDT electrode distance, the thickness of each electrode and the like, the longitudinal mode coupled SAW filter 700 (or 700*a*) obtains a frequency response having a desirable passband 801.

Figure 5A:
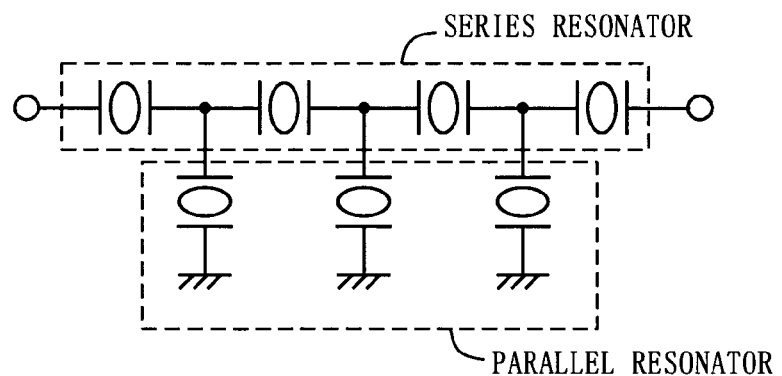
FIG. 5A is a circuit diagram of a filter having a ladder type circuit.

FIG. 5A is a circuit diagram of a filter having a ladder type circuit (hereinafter, also referred to as a "ladder type filter"). As shown in FIG. 5A, a ladder type filter includes a series resonator including acoustic wave resonators connected in series, and a parallel resonator including acoustic wave resonators connected in parallel to the series resonator.

Figure 5B:
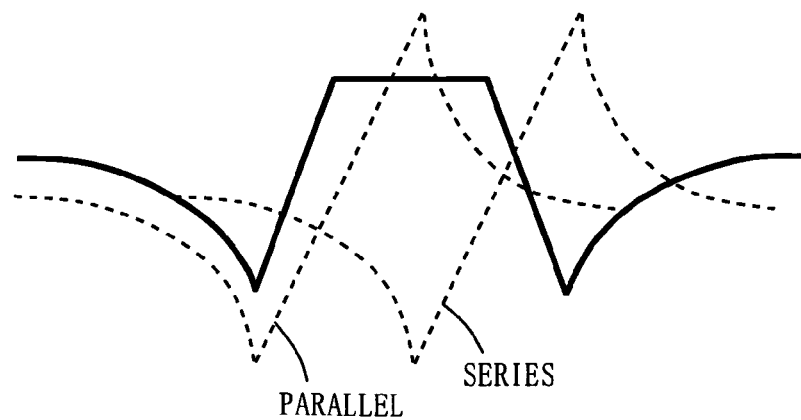
FIG. 5B shows a characteristic of the ladder type filter shown in FIG. 5A.

FIG. 5B shows a characteristic of the ladder type filter shown in FIG. 5A. In FIG. 5B, the dashed line represents the characteristic of the series resonator and the parallel resonator. As shown here, the series resonator and the parallel resonator each have a resonance point and an anti-resonance point. By connecting the series resonator and the parallel resonator having such a characteristic to each other, the frequency response as represented by the solid line in FIG. 5B is obtained.

Figure 5C:
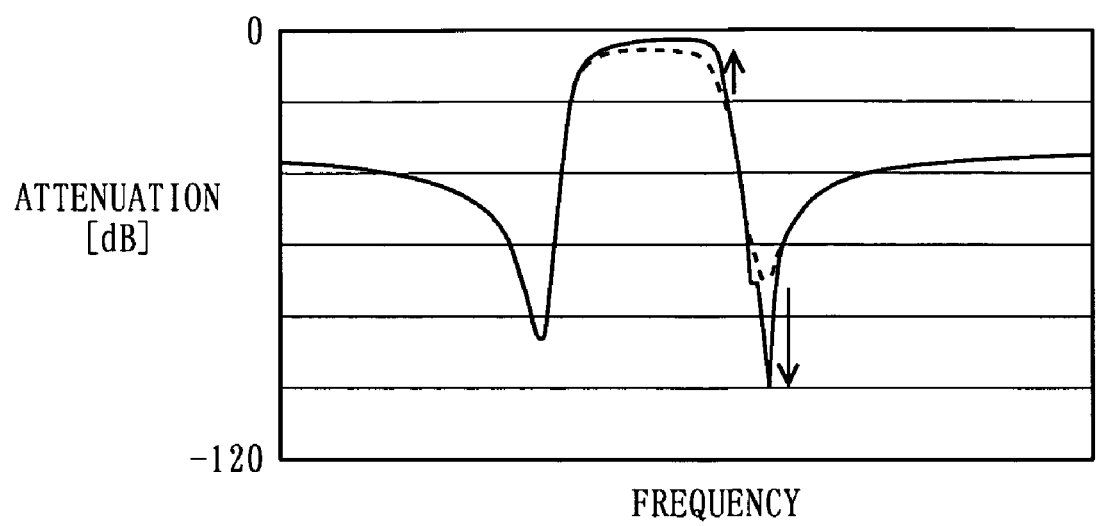
FIG. 5C shows frequency characteristics of the ladder type filter when the Q value of the series resonator is increased.

FIG. 5C shows frequency characteristics of the ladder type filter when the Q value of the series resonator is increased. As shown in FIG. 5C, when the Q value of the series resonator is increased, the attenuation in a high frequency range can be made steep.

Figure 5D:
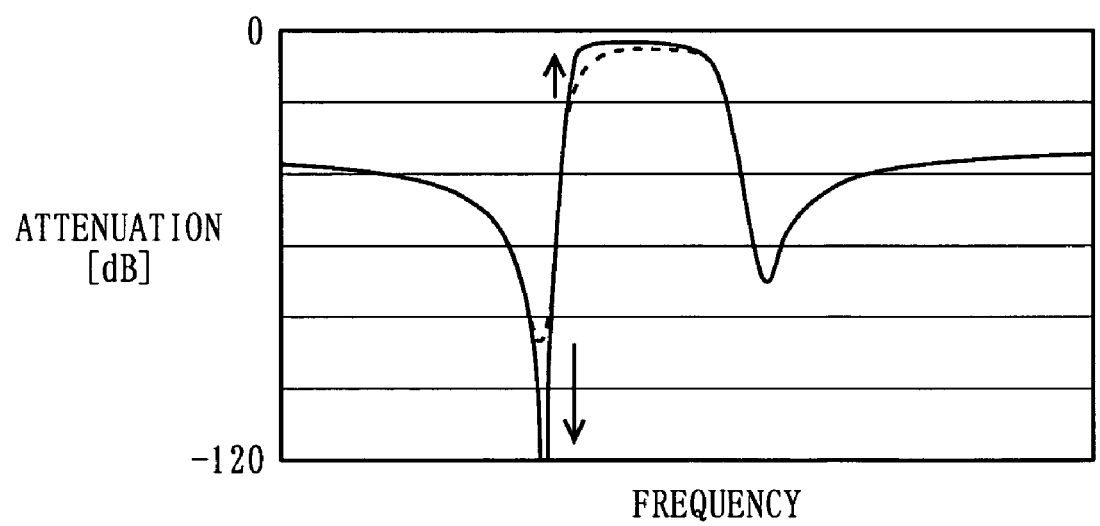
FIG. 5D shows frequency characteristics of the ladder type filter when the Q value of the parallel resonator is increased.

FIG. 5D shows frequency characteristics of the ladder type filter when the Q value of the parallel resonator is increased. As shown in FIG. 5D, when the Q value of the parallel resonator is increased, the attenuation in a low frequency range can be made steep.

Figure 5E:
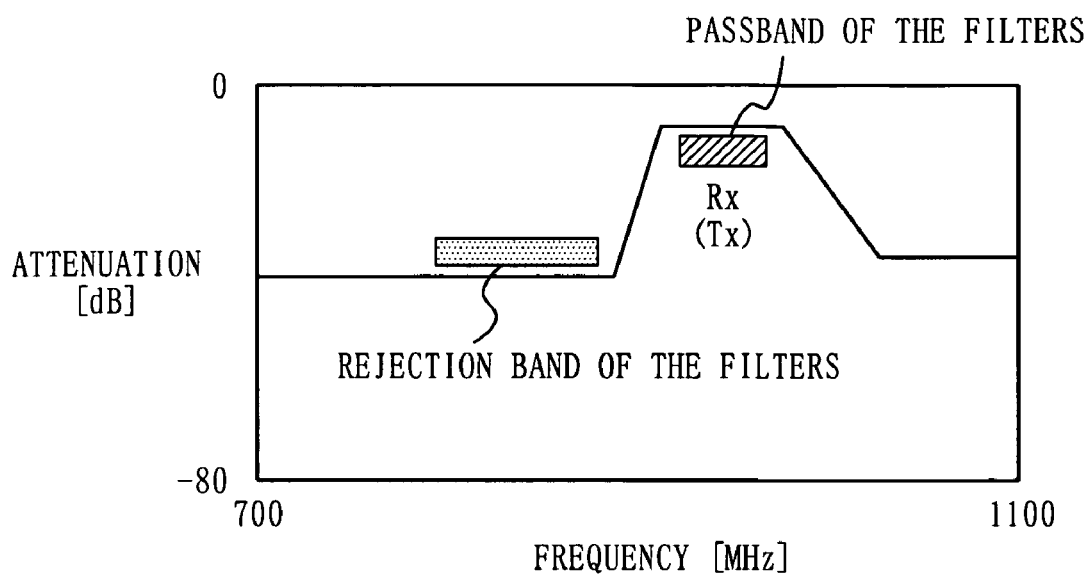
FIG. 5E is a conceptual view showing a frequency response of a ladder type filter including SAW resonators as acoustic wave resonators.
Figure 5F:
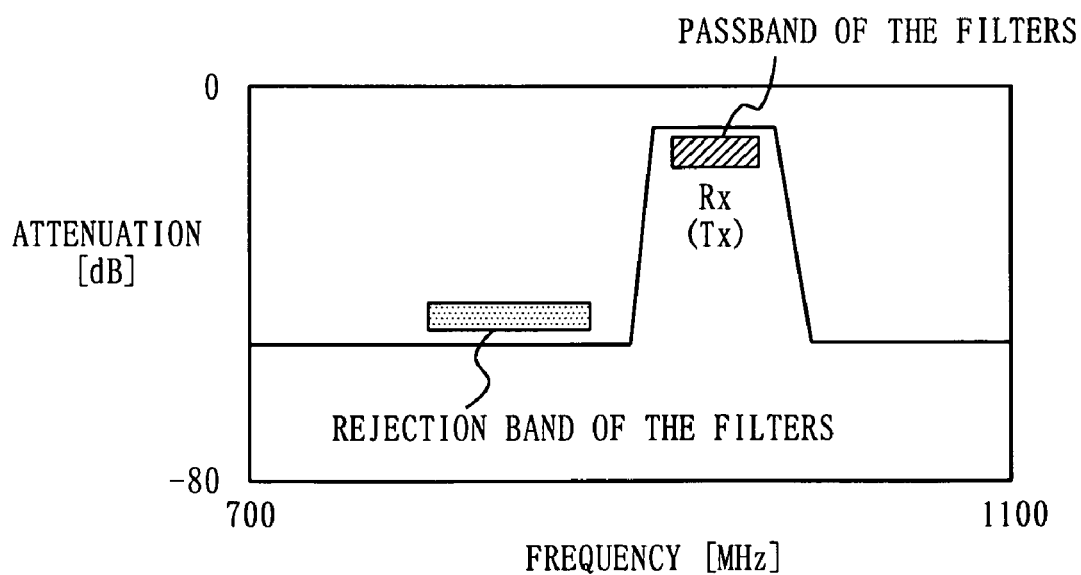
FIG. 5F is a conceptual view showing a frequency response of a ladder type filter including FBARs as acoustic wave resonators.

By using a ladder type filter, a desirable frequency response can be easily obtained as described above. FIG. 5E is a conceptual view showing a frequency response of a ladder type filter including SAW resonators as acoustic wave resonators. FIG. 5F is a conceptual view showing a frequency response of a ladder type filter including FBARs as acoustic wave resonators. An FBAR has a higher Q value than an SAW resonator, and thus the FBAR can realize a steep attenuation characteristic with low loss as shown in FIG. 5C and FIG. 5D. Accordingly, as can be seen from FIG. 5E and FIG. 5F, when the FBARs are used as the acoustic wave resonators, a more steep filter characteristic can be obtained. Preferably, as shown in FIG. 1B, the transmission filter is formed as a ladder type filter in which FBARs are used for the series resonator and the parallel resonator. With such a structure, a steep filter characteristic can be obtained. Only the series resonator may include FBARs.

In the transmission filter 101 having a ladder type circuit, the number of the FBARs 201, 202 and 203 as acoustic wave resonators connected in series is larger than the number of FBARs 204 and 205 as acoustic wave resonators connected in parallel to the series resonator. This structure is suitable for attenuating the characteristic in a high frequency range (see FIG. 5C). The reason is that in an acoustic wave resonator, an anti-resonance frequency is higher than a resonance frequency, and therefore the resonance frequency of the series resonator is used as a passband and the anti-resonance frequency of the series resonator is used as a rejection band. In addition, by providing an inductance between the acoustic wave resonators connected in parallel to the series resonator and the ground, the attenuation amount in a high frequency range of the passband can be increased or the passband can be expanded toward a lower frequency range.

The transmission filter 101 receives a transmission power from a power amplifier (not shown). Therefore, the transmission filter 101 is required to have a power durability. The power durability is improved by using a ladder type circuit including FBARs for the transmission filter 101. In the transmission filter 101, the acoustic wave resonators may either be FBARs or SAW resonators. However, in order to improve the power durability, at least an acoustic wave resonator connected to the transmission terminal Tx, which is an unbalanced type terminal, is preferably an FBAR.

In the transmission filter 101 provided as a ladder type filter, the acoustic wave resonator connected on the antenna side is preferably connected to the antenna terminal ANT in series. With such a structure, the phase of an impedance in a receiving passband, which is in a high frequency range, becomes closer to being open.

As shown in FIG. 4, the receiving filter 103 shown in FIG. 1B exhibits attenuation deterioration in a high frequency range of the passband 801 and exhibits a steep attenuation characteristic in a lower frequency range. Namely, when the frequency of the passband of the transmission filter 101 is lower than that of the passband 801 of the receiving filter 103, the antenna duplexer according to this embodiment is provided as a high performance antenna duplexer.

The low noise amplifier provided on the receiving side is often a balanced type terminal in order to improve the signal to noise characteristic of a communication apparatus. By using a filter having a balanced-unbalanced conversion function for the receiving filter 103 as shown in FIG. 1B, a balanced type terminal can be used for the receiving terminal of the antenna duplexer. Therefore, the low noise amplifier provided on a stage after the antenna duplexer can be directly connected to the antenna duplexer without using a balanced-unbalanced converter such as a balun or the like.

Examples of systems using a low frequency for a transmission passband and a high frequency for a receiving passband as described above include PCS, W-CDMA (Wideband Code Division Multiple Access), and UMTS (Universal Mobile Telecommunications System). By applying the present invention to such systems, a higher performance antenna duplexer is realized. A communication apparatus including such an antenna duplexer can provide higher performance including reduction in size and decrease in crosstalk.

By optimizing the structure of the acoustic wave resonators, the present invention is made applicable to other systems using a high frequency for a transmission passband and a low frequency for a receiving passband.

The number and locations of acoustic wave resonators of the transmission filters 101 and 101a and the receiving filters 103 and 103a are not limited to those shown in FIG. 1B or FIG. 1D. According to the present invention, as long as the following conditions are fulfilled, nothing except for the structure of the longitudinal mode coupled surface acoustic wave filters is specifically limited: either one of the transmission terminal connected to the transmission filter and the receiving terminal connected to the receiving filter is a balanced type terminal, and the other is an unbalanced type terminal; the transmission filter and the receiving filter each include surface acoustic wave resonators or film bulk acoustic resonators; and the balanced type terminal is connected to the longitudinal mode coupled surface acoustic wave filter. Preferably, either the transmission filter or the receiving filter which is connected to an unbalanced type terminal (in FIG. 1B, the transmission filter 101; and in FIG. 1D, the receiving filter 103a) is a ladder type filter including SAW resonators or FBARs. With such a structure, a good filter characteristic is obtained.

It is described in the above that an inductor may be connected to the parallel resonator of a ladder type filter. The location and the manner of connection of the inductor are not specifically limited, and only need to be optimized for a desirable filter characteristic. The inductor may be realized by using a line in the transmission (or receiving) filter or by being inserted into a substrate. A bonding wire may be used as the inductor.

In the above, an FBAR having a cavity as shown in FIG. 2B is described. Alternatively, an acoustic mirror or any other structure which can realize an acoustic wave resonator may be used for an FBAR.

The longitudinal mode coupled SAW filter described in this embodiment may be connected to another longitudinal mode coupled SAW filter in tandem or to an acoustic wave resonator. For example, the power durability of a receiving filter is further improved by connecting an FBAR to the longitudinal mode coupled SAW filter in series or in parallel.

Figure 6:
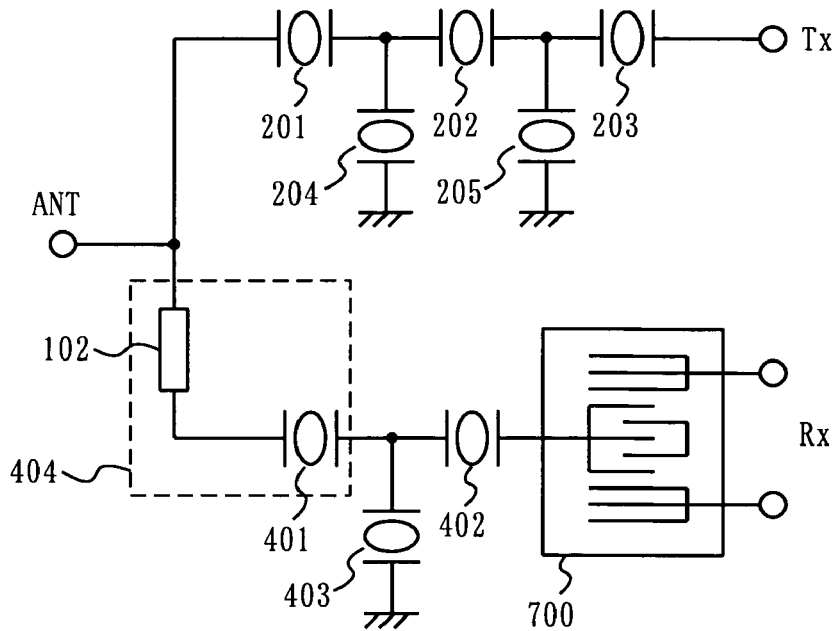
FIG. 6 shows a structure of an antenna duplexer according to a modification of the first embodiment of the present invention.

FIG. 6 shows a structure of an antenna duplexer according to a modification of the first embodiment of the present invention. As shown in FIG. 6, the phase shifter 102 and the FBAR 401 connected to the phase shifter 102 are preferably provided on one, same substrate 404. By providing a phase shifter on the Si substrate as shown here, the reduction in loss of the phase shifter is realized, and in addition, the power durability of the filter at the rejection band is improved.

Figure 7:
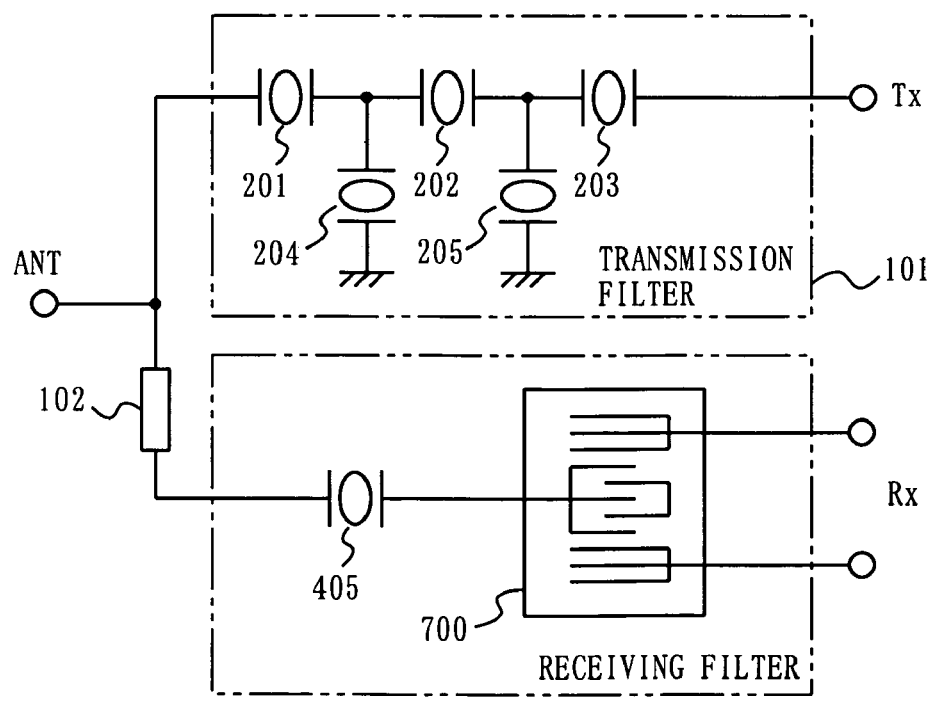
FIG. 7 shows a structure of an antenna duplexer according to another modification of the first embodiment of the present invention.

FIG. 7 shows a structure of an antenna duplexer according to another modification of the first embodiment of the present invention. As shown in FIG. 7, at least one acoustic wave resonator 405 only is needed to be connected in series between the phase shifter 102 and the longitudinal mode coupled SAW filter 700. The reason is that the longitudinal mode coupled SAW filter obtains a filter characteristic by multiple modes. The receiving filter shown in FIG. 7 is also usable as a transmission filter when the transmission terminal is a balanced type terminal. Preferably, a ladder type filter including SAW resonators or FBARs is connected between the phase shifter 102 and the longitudinal mode coupled SAW filter 700. The acoustic wave resonators included in the ladder type filter are preferably all FBARs. In the case where the longitudinal mode coupled SAW filter 700 is included in the receiving filter, the acoustic wave resonators other than the longitudinal mode coupled SAW filter 700 are preferably FBARs.

In the case where the antenna (not shown) connected to the antenna terminal ANT has a certain structure, the antenna terminal ANT may be a balanced type terminal.

Figure 8:
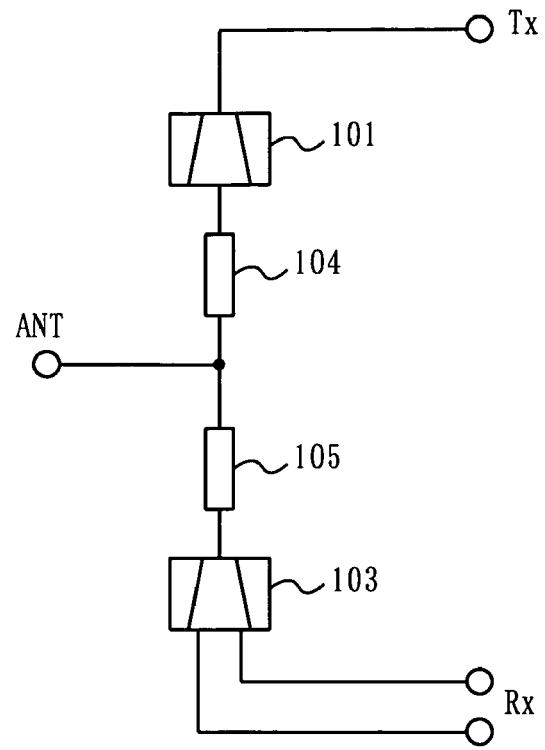
FIG. 8 shows another location where a phase shifter is provided.
Figure 9:
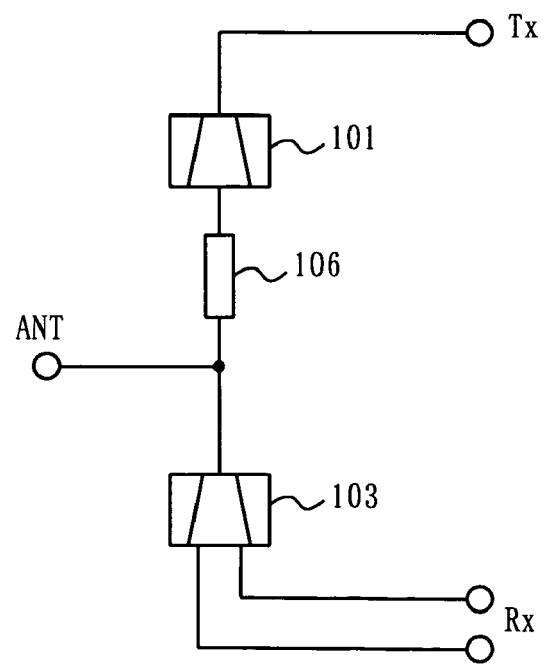
FIG. 9 shows still another location where a phase shifter is provided.

The location of the phase shifter may not be limited to the location shown in FIG. 1A or FIG. 1C. As shown in FIG. 8, a first phase shifter 104 may be connected between the antenna terminal ANT and the transmission filter 101, and a second phase shifter 105 may be connected between the antenna terminal ANT and the receiving filter 103. Alternatively as shown in FIG. 9, a phase shifter 106 may be connected only between the antenna terminal ANT and the transmission filter 101. With the structure where a phase shifter for adjusting the phase of an impedance of the transmission filter or the receiving filter is connected at least either between the transmission filter and the antenna terminal or between the receiving filter and the antenna terminal, the transmission signal and/or the receiving signal is prevented from bypassing.

The transmission filter and/or the receiving filter connected to the phase shifter preferably includes an FBAR connected to the phase shifter. With such a structure, the power durability of the filter at the rejection band can be improved. Preferably, as shown in FIG. 6, the phase shifter and the FBAR are provided on the same substrate. With such a structure, the reduction in loss of the phase shifter is realized, and in addition, the power durability of the filter at the rejection band is improved.

Figure 10:
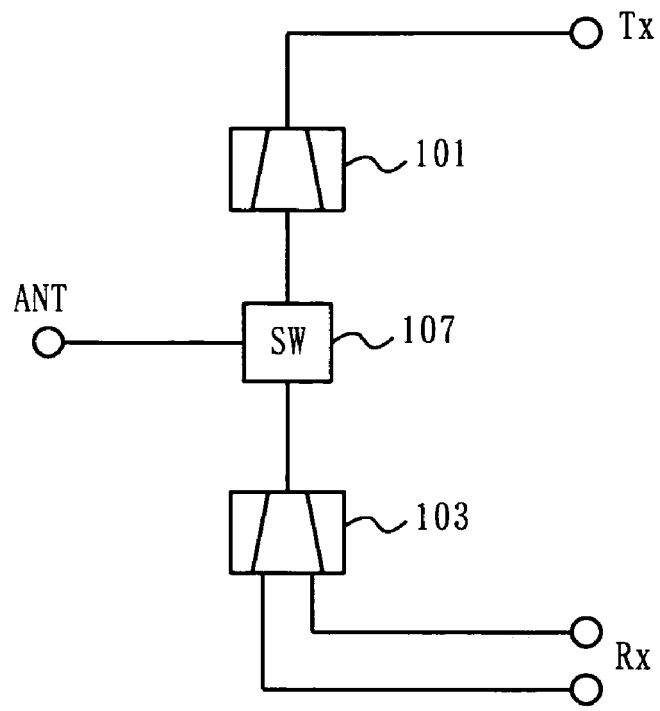
FIG. 10 is a block diagram of an antenna duplexer including a switch circuit 107.

In order to prevent the transmission signal and/or the receiving signal from bypassing, as shown in FIG. 10, the transmission signal may be switched to the antenna terminal ANT, and the receiving signal may be switched to the receiving filter 103 by a switch circuit 107. As the switch circuit 107, an MEMS-SW (Micro Electro Mechanical Systems-Switch) may be used.

In the case where the phase of the impedance of the transmission filter or the receiving filter is already adjusted, the phase shifter may be omitted. Namely, for the present invention, the phase shifter is not indispensable.

Hereinafter, the case where in either the transmission filter or the receiving filter which is connected to a balanced type terminal, the acoustic wave resonators other than the longitudinal mode coupled SAW filter connected to the balanced type terminal are all FBARs will be discussed. In this case, the FBARs and the longitudinal mode coupled SAW filter are preferably provided on the same substrate. Such a structure can minimize the inter-chip connection loss. However, in the case where the passband of the filter is a 2 GHz or higher band, it is difficult to realize an SAW resonator on a single crystalline substrate. In this case, it is preferable to realize a longitudinal mode coupled SAW filter on a large sound velocity thin film formed of, for example, AlN. However, the balanced-unbalanced conversion, when performed only by FBARs, causes a large loss. Therefore, the longitudinal mode coupled SAW filter is preferably realized using a process compatible to the process of forming the FBARs.

In the case where the FBARs and the longitudinal mode coupled SAW filter are provided on the same substrate as described above it is preferable that the FBARs are not located in a direction in which the surface acoustic wave from the longitudinal mode coupled SAW filter is propagated. Such a structure can suppress interference of acoustic waves and thus unnecessary spurious can be removed.

Preferably, a piezoelectric thin film, which is the above-described large sound velocity thin film formed of AlN or the like and provided in an area between the longitudinal mode coupled SAW filter and the FBARs, is removed by edging. Such a structure can suppress interference of acoustic waves and thus unnecessary spurious can be removed.

Preferably, the surface roughness of the piezoelectric thin film is equal to or less than 1 nm. Such a structure can suppress the propagation loss in the longitudinal mode coupled SAW filter.

The FBARs and the longitudinal mode coupled SAW filter may be provided three-dimensionally. In this case, the FBARs may be flip-chip-mounted on the longitudinal mode coupled SAW filter. With such a structure, the inter-chip connection loss can be minimized. Alternatively, the longitudinal mode coupled SAW filter may be flip-chip-mounted on the FBARs. With such a structure also, the inter-chip connection loss can be minimized.

Second Embodiment

Figure 11:
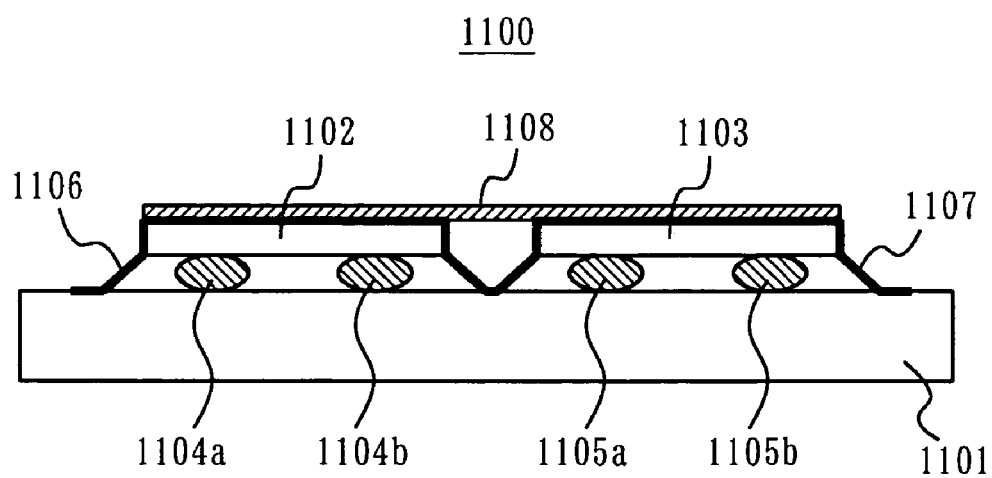
FIG. 11 shows a structure of an antenna duplexer 1100 according to a second embodiment of the present invention.

FIG. 11 shows a structure of an antenna duplexer 1100 according to a second embodiment of the present invention. In FIG. 11, the antenna duplexer 1100 includes a transmission filter 1102 and a receiving filter 1103 which are mounted on a mounting substrate 1101 by face-down bonding. The mounting substrate 1101 has lines, a phase shifter and external terminals (none is shown) built therein. The mounting substrate 1101 and the transmission filter 1102 are electrically connected to each other via bumps 1104a and 1104b, and the mounting substrate 1101 and the receiving filter 1103 are electrically connected to each other via bumps 1105a and 1105b. The transmission filter 1102 includes FBARs. The receiving filter 1103 includes a longitudinal mode coupled SAW filter. The transmission filter 1102 and the receiving filter 1103 are provided as separate chips. All the structures and modifications described in the first embodiment are also applicable to the transmission filter 1102 and the receiving filter 1103 shown in FIG. 11, needless to say.

The transmission filter 1102 and the receiving filter 1103 are respectively covered with, for example, shields 1106 and 1107 to be airtightly sealed. Upper surfaces of the transmission filter 1102 and the receiving filter 1103 are secured by a heat-resistant adhesive tape 1108. The adhesive tape 1108 can be made flat by forming the transmission filter 1102 and the receiving filter 1103 with substantially an equal thickness. Thus, the antenna duplexer 1100 can be adsorbed to a pick-up tool used for mounting. With such a structure, an antenna duplexer having a balanced-type terminal can be realized.

Figure 12:
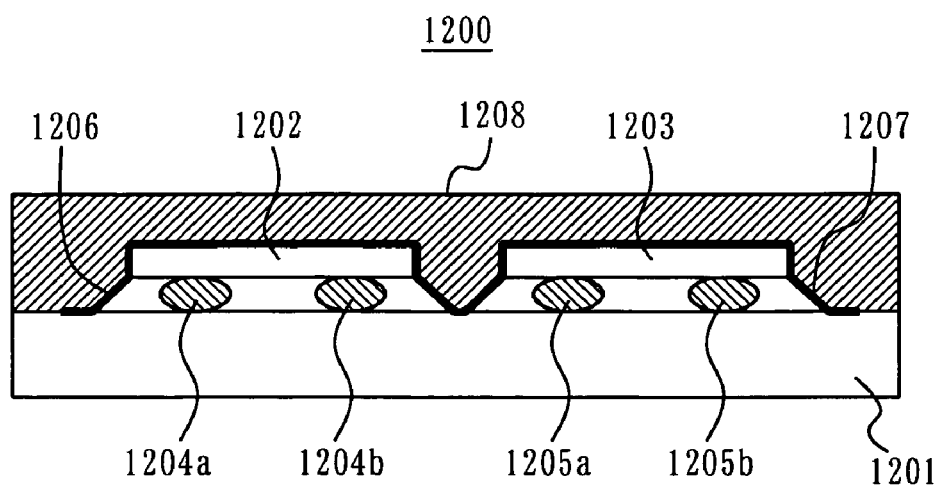
FIG. 12 shows a structure of another antenna duplexer 1200 according to the second embodiment of the present invention.

FIG. 12 shows a structure of another antenna duplexer 1200 according to the second embodiment of the present invention. In FIG. 12, the antenna duplexer 1200 includes a transmission filter 1202 and a receiving filter 1203 which are mounted on a mounting substrate 1201 by face-down bonding. The mounting substrate 1201 has lines, a phase shifter and external terminals (none is shown) built therein. The mounting substrate 1201 and the transmission filter 1202 are electrically connected to each other via bumps 1204a and 1204b, and the mounting substrate 1201 and the receiving filter 1203 are electrically connected to each other via bumps 1205a and 1205b. The transmission filter 1202 includes FBARs. The receiving filter 1203 includes a longitudinal mode coupled SAW filter. The transmission filter 1202 and the receiving filter 1203 are provided as separate chips. All the structures and modifications described in the first embodiment are also applicable to the transmission filter 1202 and the receiving filter 1203 shown in FIG. 12, needless to say.

The transmission filter 1202 and the receiving filter 1203 are respectively covered with, for example, shields 1206 and 1207 to be airtightly sealed. The transmission filter 1202 and the receiving filter 1203 have different thicknesses. The mounting substrate 1201 is molded by, for example, a resin material 1208 which covers the transmission filter 1202 and the receiving filter 1203. An upper surface of the resin material 1208 is made substantially flat. Thus, the antenna duplexer 1200 can be adsorbed to a pick-up tool used for mounting. With such a structure, an antenna duplexer having a balanced-type terminal can be realized.

In the second embodiment, the lines, the phase shifter, and the external terminals are optimized for a desirable characteristic of the antenna duplexer.

In FIG. 11 and FIG. 12, the transmission filter and the receiving filter are separately covered with a shield. Alternatively, the transmission filter and the receiving filter may be covered together with a single shield. The shield is not limited to having the shape shown in FIG. 11 or FIG. 12, and may have any shape with which the shield can seal the transmission filter and the receiving filter airtightly.

In FIG. 12, the transmission filter 1202 and the receiving filter 1203 have different thicknesses. Alternatively, transmission filter 1202 and the receiving filter 1203 may have an equal thickness.

The transmission filter and the receiving filter are provided by face-down bonding. Alternatively, the transmission filter and the receiving filter may be wire-bonded to be airtightly sealed. Namely, the transmission filter and the receiving filter are only needed to be mounted on the same substrate and molded with a resin material, such that an upper surface thereof is substantially flat.

In the second embodiment, the antenna duplexer includes one transmission filter and one receiving filter which are provided on a mounting substrate. Alternatively, a plurality of transmission filters and a plurality of receiving filters may be mounted on the same substrate, such that a plurality of antenna duplexers are provided. In this case, by using a semiconductor switch or a wave divider, an antenna duplexer compatible to multi-mode or multi-band applications is provided.

Third Embodiment

Figure 13:
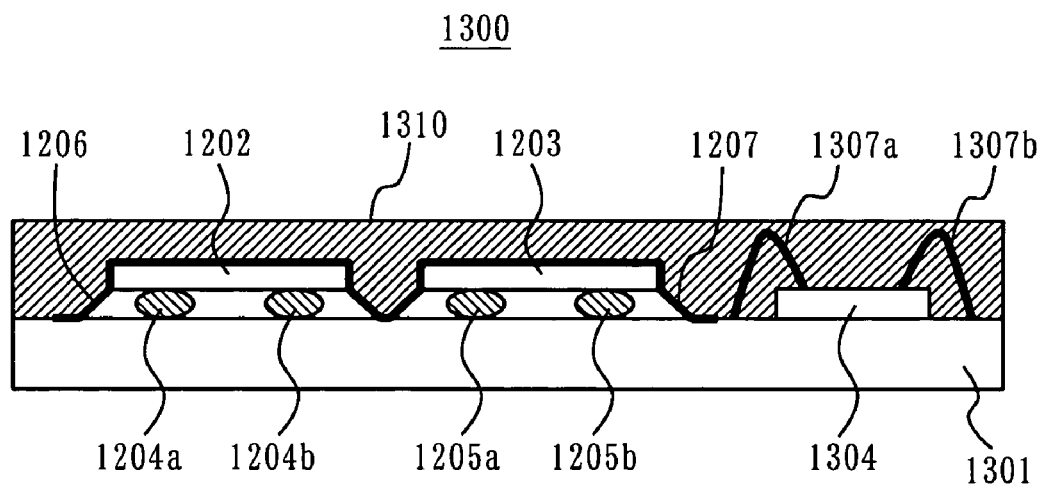
FIG. 13 shows a structure of an RF module 1300 according to a third embodiment of the present invention.

FIG. 13 shows a structure of an RF module 1300 according to a third embodiment of the present invention. In FIG. 13, identical elements to those shown in FIG. 12 will bear identical reference numerals thereto and descriptions thereof will be omitted. In FIG. 13, the RF module 1300 includes a transmission filter 1202 and a receiving filter 1203 which are mounted on a mounting substrate 1301 by face-down bonding. A semiconductor device 1304 is wire-bonded on the mounting substrate 1301. The mounting substrate 1301 has lines, a phase shifter and external terminals (none is shown) built therein. The mounting substrate 1301 and the transmission filter 1202 are electrically connected to each other via bumps 1204a and 1204b, and the mounting substrate 1301 and the receiving filter 1203 are electrically connected to each other via bumps 1205a and 1205b. The mounting substrate 1301 and the semiconductor device 1304 are electrically connected to each other via wires 1307a and 1307b. The semiconductor device 1304 and the transmission filter 1202 and/or the receiving filter 1203 are connected to each other via the lines built in the mounting substrate 1301. The mounting substrate 1301 is molded by, for example, a resin material 1310 which covers the transmission filter 1202, the receiving filter 1203 and the semiconductor device 1304. An upper surface of the resin material 1310 is made substantially flat. Thus, the RF module 1300 can be adsorbed to a pick-up tool used for mounting. With such a structure, an RF module including an antenna duplexer having a balance-type terminal and a semiconductor device mounted on the same substrate is realized.

In the third embodiment, the lines, the phase shifter, and the external terminals built in the mounting substrate are optimized for a desirable characteristic of the antenna duplexer.

In the third embodiment, the transmission filter and the receiving filter are provided by face-down bonding. Alternatively, the transmission filter and the receiving filter may be wire-bonded to be airtightly sealed. The transmission filter and the receiving filter are only needed to be molded by a resin material or the like, such that an upper surface of the RF module 1300 is substantially flat.

In the third embodiment, the semiconductor device is wire-bonded. Alternatively, the semiconductor device may be mounted by face-down bonding. The semiconductor is only needed to be molded by a resin material together with the transmission filter and the receiving filter, such that an upper surface of the RF module 1300 is substantially flat.

All the structures and modifications described in the first embodiment are also applicable to the transmission filter and the receiving filter in the third embodiment.

As the semiconductor device 1304, a low noise amplifier is usable. Alternatively, a switch may be used as the semiconductor device 1304. For example, a plurality of transmission filters, a plurality of receiving filters and a semiconductor switch may be mounted on the same substrate to provide an RF module suitable to multi-mode and/or multi-band mobile phone applications.

Fourth Embodiment

Figure 14:
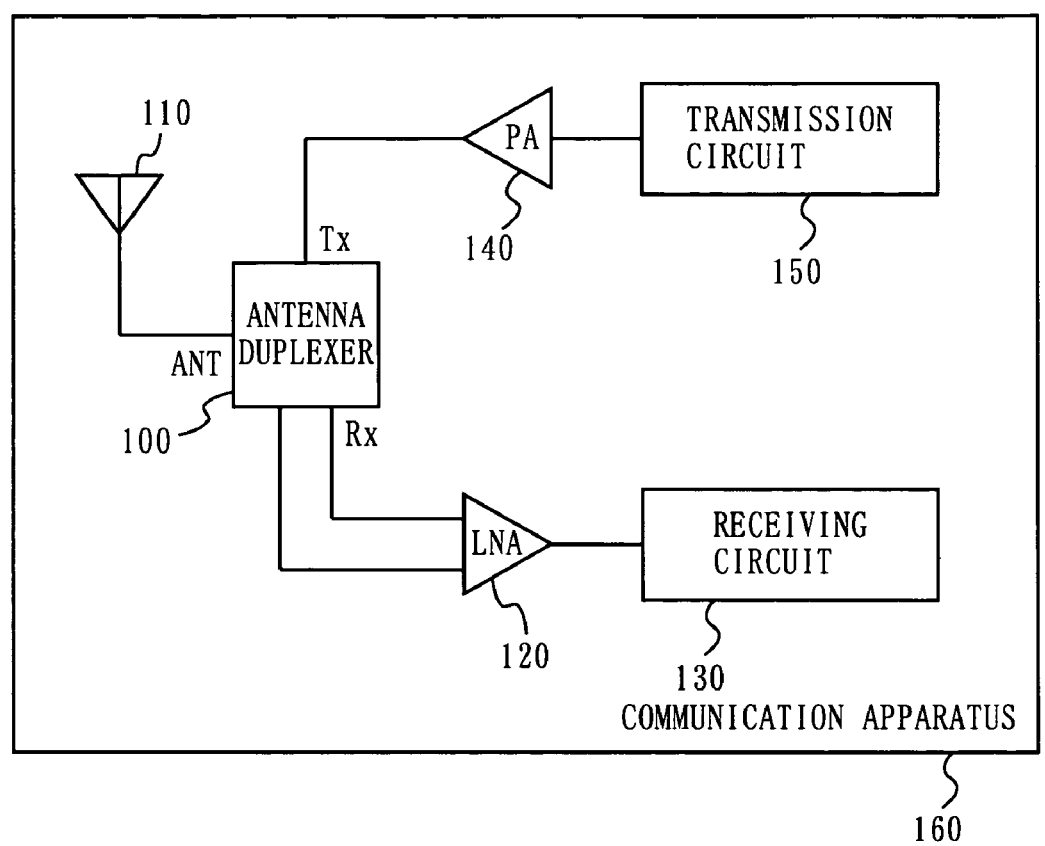
FIG. 14 is a block diagram showing a functional structure of a communication apparatus 160 according to a fourth embodiment of the present invention.
Figure 15:
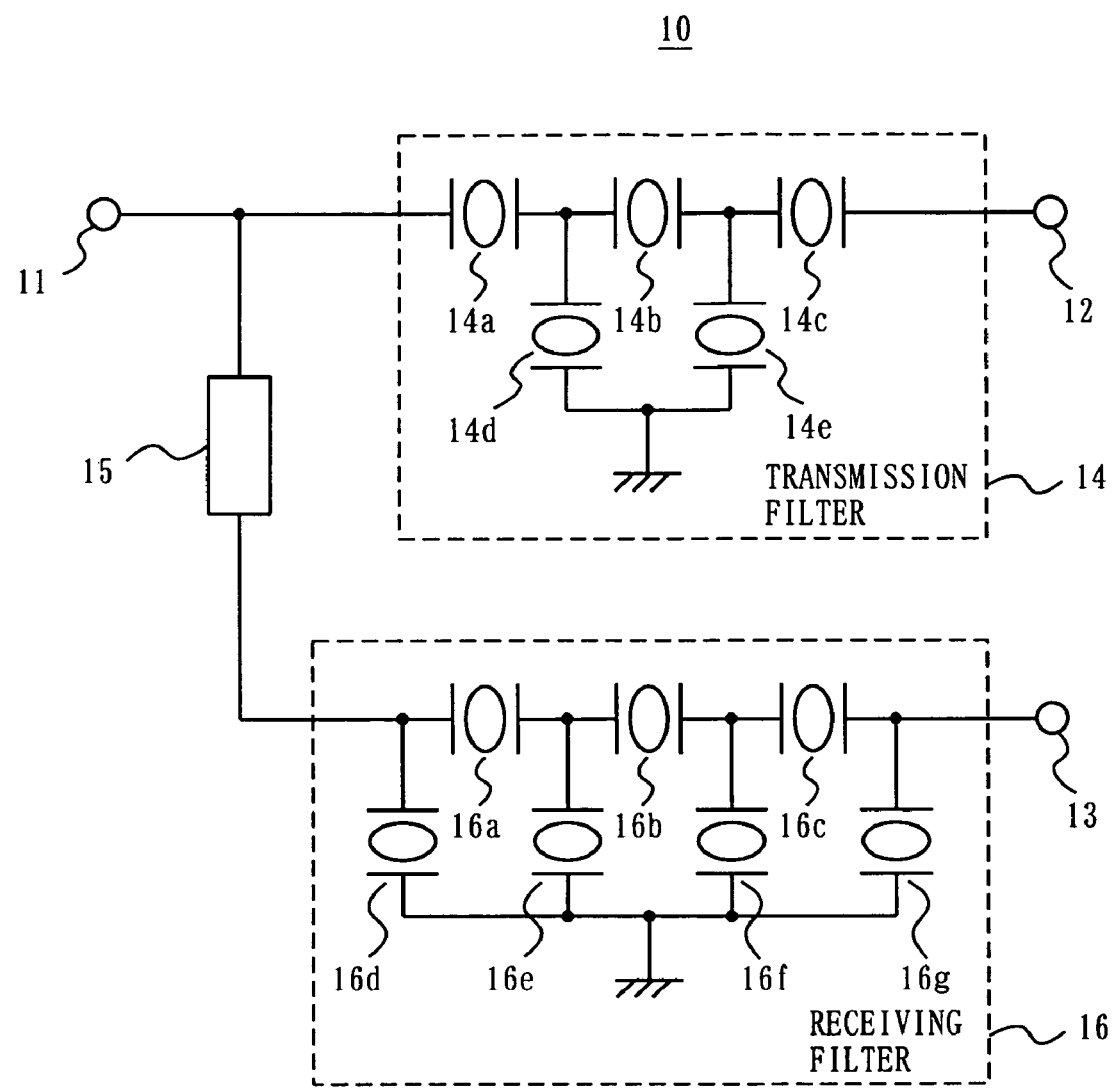
FIG. 15 shows a structure of an antenna duplexer described in Japanese Laid-Open Patent Publication No. 2001-24476.
Figure 16:
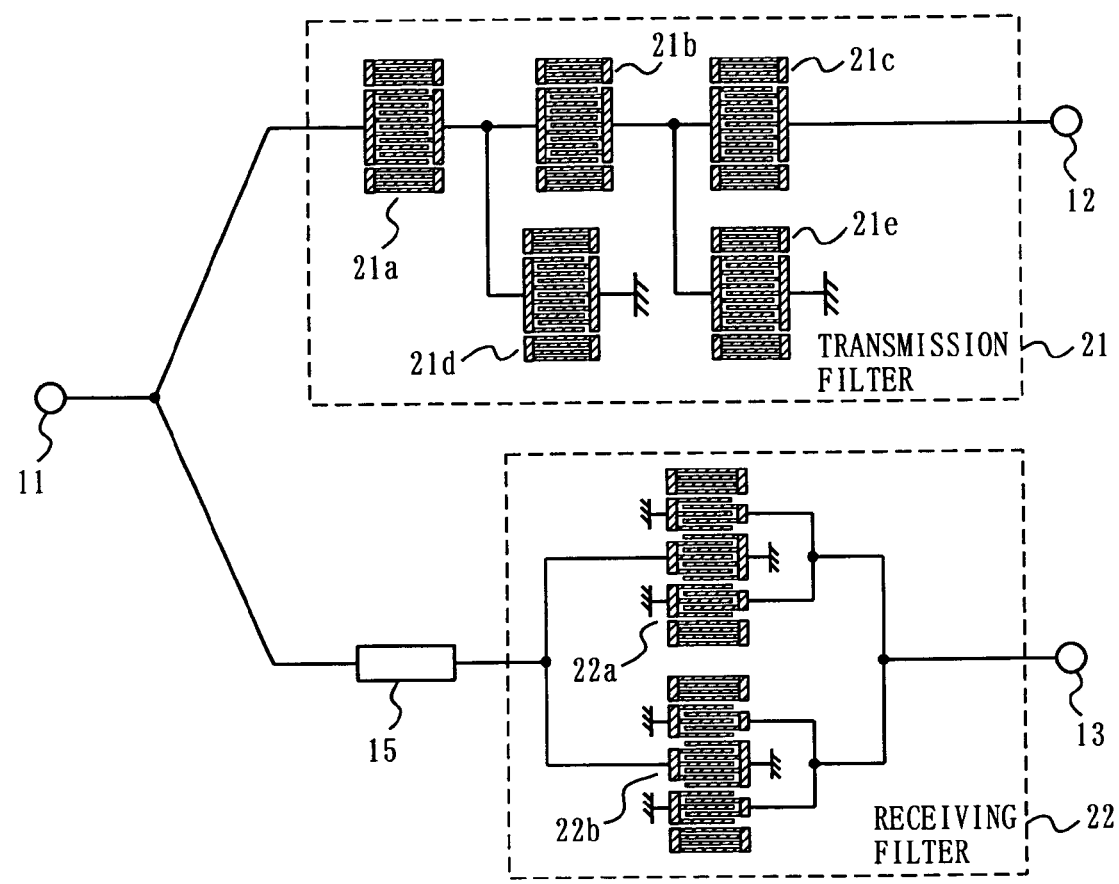
FIG. 16 shows a structure of an antenna duplexer described in Japanese Laid-Open Patent Publication No. 2003-249842.

FIG. 14 is a block diagram showing a functional structure of a communication apparatus 160 according to a fourth embodiment of the present invention. In FIG. 14, the communication apparatus 160 includes an antenna 110, an antenna duplexer 100, a low noise amplifier (LNA) 120, a receiving circuit 130, a power amplifier (PA) 140, and a transmission circuit 150. A transmission signal, which is output from the transmission circuit 150 is amplified by the power amplifier 140 and is input to the antenna duplexer 100. Among signals from the power amplifier 140, the antenna duplexer 100 passes only the signals in a transmission band to the antenna 110. The antenna 110 outputs such transmission signals in the form of electric waves. A signal which is received by the antenna 110 is input to the antenna duplexer 100. Among signals received by the antenna 110, the antenna duplexer 100 passes only the signals in a receiving band and converts the signals into balanced signals. The antenna duplexer 100 then inputs the signals to the low noise amplifier 120. The low noise amplifier 120 amplifiers the input balanced signals and inputs the signals to the receiving circuit 130. The receiving circuit 130 performs demodulation processing based on the input signals.

According to the fourth embodiment of the present invention, the communication apparatus 160 including the antenna duplexer 100 directly connected to the low noise amplifier 120 having a balanced-type terminals is provided.

All the structures and modifications described in the first embodiment are also applicable to the communication apparatus shown in FIG. 14. An antenna duplexer having a suitable structure can be used in accordance with whether the balanced-type terminal is needed for the transmission side or the receiving side.

An antenna duplexer according to the present invention has a balanced type terminal, and is useful for an RF device which can be directly connected to a semiconductor device or the like having a balanced type terminal. An antenna duplexer according to the present invention can be applied to an RF module, a communication apparatus or the like.

While the invention has been described in detail, the foregoing description is in all aspects illustrative and not restrictive. It is understood that numerous other modifications and variations can be devised without departing from the scope of the invention.

What is claimed is:

1. An antenna duplexer comprising:
   an antenna terminal;
   a transmission terminal;
   a receiving terminal;
   a transmission filter connected between the antenna terminal and the transmission terminal; and
   a receiving filter connected between the antenna terminal and the receiving terminal, wherein:
   one of the transmission terminal and the receiving terminal is a balanced type terminal, and another of the transmission terminal and the receiving terminal is an unbalanced type terminal;
   at least one of the transmission filter and the receiving filter includes a surface acoustic wave resonator;
   the balanced type terminal is connected to a longitudinal mode coupled surface acoustic wave filter,
   both the transmission filter and the receiving filter include a film bulk acoustic resonator serially connected to the antenna terminal and at least one of the transmission filter and the receiving filter includes a film bulk acoustic resonator connected in parallel between the antenna terminal and ground; and
   a number of film bulk acoustic resonators connected in parallel between the antenna terminal and ground is less than a number of film bulk acoustic resonators serially connected to the antenna terminal.

2. The antenna duplexer according to claim 1, wherein the transmission filter or the receiving filter connected to the unbalanced type terminal is a ladder type filter.

3. The antenna duplexer according to claim 2, wherein the transmission filter or the receiving filter connected to the balanced type terminal includes at least one surface acoustic wave resonator or at least one film bulk acoustic resonator connected in series between the longitudinal mode coupled surface acoustic wave filter and the antenna terminal.

4. The antenna duplexer according to claim 3, wherein The transmission filter or the receiving filter connected to the balanced type terminal includes a ladder type filter connected between the longitudinal mode coupled surface acoustic wave filter and the antenna terminal.

5. The antenna duplexer according to claim 4, further comprising a phase shifter for adjusting the phase of an impedance of the transmission filter or the receiving filter, the phase shifter being connected either between the transmission filter and the antenna terminal or between the receiving filter and the antenna terminal.

6. The antenna duplexer according to claim 5, wherein the phase shifter is a strip line or a lumped constant device.

7. The antenna duplexer according to claim 6, wherein the transmission filter or the receiving filter connected to the phase shifter includes a film bulk acoustic resonator connected to the phase shifter.

8. The antenna duplexer according to claim 7, wherein the phase shifter and the film bulk acoustic resonator connected to the phase shifter are provided on a single substrate.

9. The antenna duplexer according to claim 8, wherein the transmission terminal is the unbalanced type terminal.

10. The antenna duplexer according to claim 9, wherein the transmission terminal is connected to a film bulk acoustic resonator.

11. The antenna duplexer according to claim 10, wherein:
the transmission filter is a ladder type filter; and
a resonator connected in series in the ladder type filter includes the film bulk acoustic resonators connected to the transmission terminal.

12. The antenna duplexer according to claim 11, wherein a resonator connected in parallel in the ladder type filter includes the film bulk acoustic resonator connected to the transmission terminal.

13. The antenna duplexer according to claim 12, wherein the receiving filter includes at least one film bulk acoustic resonator as an acoustic wave resonator other than the longitudinal mode coupled surface acoustic wave filter.

14. The antenna duplexer according to claim 1, wherein the transmission filter and the receiving filter are mounted on a single mounting subtrate.

15. The antenna duplexer according to claim 14, wherein the transmission filter and/or the receiving filter is mounted on the mounting substrate by face-down bonding.

16. The antenna duplexer according to claim 15, wherein the transmission filter and the receiving filter have substantially equal thickness.

17. The antenna duplexer according to claim 14, wherein the transmission filter and the receiving filter are molded by a resin.

18. The antenna duplexer according to claim 17, wherein an upper surface of the resin is substantially flat.

19. The antenna duplexer according to claim 1, wherein a number of film bulk acoustic resonator serially connected to the antenna terminal is n, wherein n is an integer no less than 2, and a number of film bulk acoustic resonators connected in parallel between the antenna terminal and ground is n−1.

20. An RF module comprising:
an antenna duplexer, and
a semiconductor device, wherein:
    the antenna duplexer and the semiconductor device are mounted on a single mounted subtrate; and
    the antenna duplexer includes:
        an antenna terminal;
        a transmission terminal;
        a receiving terminal;
        a transmission filter connected between the antenna terminal and the transmission terminal; and
        a receiving filter connected between the antenna terminal and the receiving terminal; wherein:
            one of the transmission terminal and the receiving terminal is a balanced type terminal, and another of the transmission terminal and the receiving terminal is an unbalanced type terminal;
            at least one of the transmission filter and the receiving filter includes a surface acoustic wave resonator;
            the balance type terminal is connected to a longitudinal mode coupled surface acoustic wave filter;
            both the transmission filter and the receiving filter include a film bulk acoustic resonator serially connected to the antenna terminal and at least one of the transmission filter and the receiving filter includes a film bulk acoustic resonator connected in parallel between the antenna terminal and ground; and
            a number of film bulk acoustic resonators connected in parallel between the antenna terminal and ground is less than a number of a film bulk acoustic resonators serially connected to the antenna terminal.

21. The RF module according to claim 20, wherein the semiconductor device is a low noise amplifier.

22. The RF module according to claim 20, wherein the semiconductor device is a switch.

23. A communication apparatus including an antenna duplexer, wherein the antenna duplexer includes:
an antenna terminal;
a transmission terminal;
a receiving terminal;
a transmission filter connected between the antenna terminal and the transmission terminal; and
a receiving filter connected between the antenna terminal and the receiving terminal, wherein:
    one of the transmission terminal and the receiving terminal is a balanced type terminal, and another of the transmission terminal and the receiving is an unbalanced type terminal;
    at least one of the transmission filter and the receiving filter includes a surface acoustic wave resonator;
    the balanced type terminal is connected to a longitudinal mode coupled surface acoustic wave filter;
    both the transmission filter and the receiving filter include a film bulk acoustic resonator serially connected to the antenna terminal and at least one of the transmission filter and the receiving filter includes a film bulk acoustic resonator connected in parallel between the antenna terminal and ground; and
    a number of film bulk acoustic resonators connected in parallel between the antenna terminal and ground is less than a number of film bulk acoustic resonators serially connected to the antenna terminal.

* * * * *